US006396201B1

(12) United States Patent
Ide et al.

(10) Patent No.: US 6,396,201 B1
(45) Date of Patent: May 28, 2002

(54) PIEZOELECTRIC VIBRATOR

(75) Inventors: Toshinori Ide, Saku; Hisao Wakabayashi, Tokorozawa, both of (JP)

(73) Assignees: Miyota Co., Ltd., Nagano; CitizensWatch Co., Ltd., Tokyo, both of (JP)

(*) Notice: Subject to any disclaimer, the term of this patent is extended or adjusted under 35 U.S.C. 154(b) by 0 days.

(21) Appl. No.: 09/486,048
(22) PCT Filed: Aug. 14, 1998
(86) PCT No.: PCT/JP98/03635
§ 371 (c)(1),
(2), (4) Date: Feb. 22, 2000
(87) PCT Pub. No.: WO99/09647
PCT Pub. Date: Feb. 25, 1999

(30) Foreign Application Priority Data

Aug. 19, 1997 (JP) .............................. 9-240413
Aug. 19, 1997 (JP) .............................. 9-240414

(51) Int. Cl.$^7$ ................................................ H01L 41/04
(52) U.S. Cl. ........................................ 310/353; 310/366
(58) Field of Search .................................. 310/344, 348, 310/367, 353, 366

(56) References Cited

U.S. PATENT DOCUMENTS 4,183,351 A * 1/1980 Hinotani et al. ............. 126/443
4,231,353 A * 11/1980 Kanatani et al. ............. 125/443
5,585,687 A * 12/1996 Wakabayashi et al. ....... 310/366

FOREIGN PATENT DOCUMENTS

| JP | 57-115014 | 7/1982 |
| JP | 1-143516 | 10/1989 |
| JP | 2-199909 | 8/1990 |
| JP | 2-256311 | 10/1990 |
| JP | 5-18121 | 3/1993 |
| JP | 7-1627 | 1/1995 |
| JP | 8-186457 | 7/1996 |
| JP | 8-330886 | 12/1996 |
| JP | 9-93073 | 4/1997 |
| JP | 9-135141 | 5/1997 |

* cited by examiner

Primary Examiner—Brian Sircus
Assistant Examiner—Michael C. Zarroli
(74) Attorney, Agent, or Firm—Dickstein Shapiro Morin & Oshinsky LLP

(57) ABSTRACT

In a piezoelectric vibrator having a center supporting piezoelectric vibrating reed, one edge of an almost rectangular piezoelectric vibrating reed is fixed at two places of a case by a comparatively hard conductive adhesive. Also, the other edge facing the above-mentioned one edge is fixed at two other places of the case by a comparatively soft adhesive. Further, the case and a lid to cover the piezoelectric vibrating reed which constitute a container for the piezoelectric vibrator are sealed using a glass material having a low melting point of 340° C. or less. Further, in the case of a cantilever supporting piezoelectric vibrating reed, stoppers made of soft adhesive are formed at the top and bottom of the other edge facing the above-mentioned one edge with a slight clearance being provided.

10 Claims, 4 Drawing Sheets

PIEZOELECTRIC VIBRATOR

TECHNICAL FIELD

The present invention relates to the support of a piezoelectric vibrating reed and the constitution of a container in a piezoelectric vibrator.

BACKGROUND ART

A piezoelectric vibrator, such as a quartz resonator, is often supported in a box-type airtight container made of material, such as ceramic. Some piezoelectric vibrators sealed in box type containers are called surface mounted type (SMD type) vibrators. These vibrators are suitable for being mounted on printed circuit boards of electronic equipment and are often used as clock sources or the like in telecommunication equipment, portable electronic equipment, etc. A piezoelectric vibrating reed to be used for the vibrators is, for example, a strip rectangular plate type AT cut quartz vibrating reed, the outline of which is shown in a perspective view of FIG. 2. In FIG. 2, reference numeral 1 is a quartz vibrating reed, and reference numeral 11 is a quartz vibrating reed electrode film. A similar electrode film is provided on a back surface of the quartz vibrating reed 1. Reference numerals 111 and 121 are electrode lead lines of these electrode films. These lines are arranged in such a manner that they extend over both surfaces of an end of the quartz vibrating reed 1.

An example of a box type container for SMD type vibrators is composed of a lower case 2 shown in an exploded perspective view of FIG. 3 and a lid 5 shown in a perspective view of FIG. 4. The lower case 2 is a lamination of a first insulating substrate 21 and a second insulating substrate 22, both of which are made of ceramic. The first insulating substrate 21 is provided as a pattern in which bottom surface electrode terminals 211 for SMD type vibrators, and wiring patterns 213 connected with the bottom surface electrode terminals 211 by side surface patterns 212 and having through hole connecting sections 214 at important points, are metallized on a bottom surface.

On a top surface of the second insulating substrate 22, four terminals 221 for vibrating reeds are provided as metallized patterns. By means of a through hole (not shown in the drawings) provided within the top surface, the terminals 221 for vibrating reeds are connected with the wiring patterns 213 provided on the first insulating substrate 21. With regard to the four terminals 221 for vibrating reeds, two each are adjacent and the terminals which face each other in a longitudinal direction are connected. The quartz vibrating reed 1 is mounted on the lower case 2 and the electrode lead lines 111 and 121 of the quartz vibrating reed 1 are arranged on the terminals 221 for vibrating reeds. In such a position, the electrode lead lines 111 and 121 are adhered with a conductive adhesive, thereby simultaneously achieving continuity and support. At this time, it does not matter whether the quartz vibrating reed 1 is on the right side or wrong side, or what direction the longitudinal direction faces. The lid 5 is put on the lower case 2 where the quartz vibrating reed 1 is mounted, and the peripheral bottom surface is airtightly sealed utilizing the lower case 2 and glass having a low melting point. A hole 222 provided at the second insulating substrate 22 functions so that the lower case 2 does not touch the center of the quartz vibrating reed 1 which has a great vibration amplitude. Further, center grooves 223 are provided so as to avoid a short circuit of the adjacent conductive adhesives. Detailed constitution of the box type container described above is basically the same as that disclosed in Japanese Patent Application No. Hei 7-316064.

There are roughly two kinds of methods of supporting a piezoelectric vibrating reed. One (1) is a center supporting method where both of two short edges of a piezoelectric vibrating reed are glued to a lower case with a conductive adhesive or conductive and nonconductive adhesives. The other (2) is a cantilever supporting method where among the two short edges, only the edge where electrode lead lines are provided is glued to the lower case (the terminals 221 for vibrating reeds provided at the upper part of the lower case) with a conductive adhesive, and the other short edge is left not glued. For the purposes of supporting a piezoelectric vibrating reed so that the vibrating reed has sufficient strength to bear an impulse and avoiding a harmful influence of the stress (or distortion) caused by the support upon vibration of the piezoelectric vibrating reed, various proposals for improving both the supporting methods have been made heretofore.

The center supporting method (1) described above has the advantages that impact resistance sufficient to avoid damage of the piezoelectric vibrator can be obtained and a thin container can be used because the piezoelectric vibrating reed is stationary. However, it also has disadvantages as follows: due to a shrinkage caused by curing of an adhesive (heat treatment for hardening) or a difference in thermal expansion coefficient between the piezoelectric vibrating reed and a substrate of the container or an adhesive, a residual stress arises inside the piezoelectric vibrating reed of the completed piezoelectric vibrator, whereby it tends to cause such problems that an oscillation frequency differs from a target value, the temperature characteristic of the frequency and the temperature characteristic of a comfort index (CI) become turbulent, or spuriousness arises. In order to avoid these problems, in Japanese Utility Model Laid-Open Publication No. Hei 1-143516, it has been proposed that a nonconductive adhesive having a small shrinkage factor is applied to a bottom surface of each short edge of the vibrating reed so as to pass through the center support and a conductive adhesive (which generally has a large shrinkage factor) is applied to a top surface of each short edge of the vibrating reed, whereby the deterioration of characteristic which may be caused by the residual stress can be prevented. Further, in Japanese Utility Model Laid-Open Publication No. Hei 5-18121, it has been proposed that one of the short edges of the piezoelectric vibrating reed is supported by a conductive adhesive (having great hardness) and a soft silicon adhesive is applied to the other one of the short edges, whereby residual distortion is reduced or various stresses are absorbed.

In the cantilever supporting method (2) described above, the influence of stress resulting from the support upon the vibration of the piezoelectric vibrating reed may be considered negligible. However, since the cantilever piezoelectric vibrating reed is used, when a strong impulse is applied to the piezoelectric vibrator as it stands, there is a great risk of peeling of adhered parts, breaking the piezoelectric vibrating reed, or the like. In order to avoid such problems, there is a constitution such that a stopper to restrict displacement of the piezoelectric vibrating reed is provided near a short edge which is free from support. As a concrete example, Japanese Patent Laid-Open Publication No. Hei 8-330886 has disclosed a constitution in which a bolster section and a buffer section to serve as stoppers are arranged on the short edge so as not to be adhered. Further, Japanese Patent Laid-Open Publication No. Hei 8-186457 has disclosed the following art: a first adhesive is applied to a cantilever holding section of a quartz vibrating reed and temporary curing is applied to the adhered section in such a manner that the solvent splashes; the quartz vibrating reed is placed on the section and a second adhesive is applied thereto; by curing the section entirely in the manner described above, shrinkage caused by the adhesive curing is properly controlled; and by slightly lifting the other edge of the quartz vibrating reed which is not adhered up from a substrate, an adequate space is obtained between a surface of the substrate to be a stopper and the aforementioned other edge of the quartz vibrating reed.

Problems of the above-mentioned concrete examples of improvement which have been proposed heretofore will subsequently be described. With regard to a double application technology of adhesives disclosed in Japanese Utility Model Laid-Open Publication No. 1-14356 related to the center supporting method (1), since an operation of eliminating distortion is mainly applied to one of the short edges which is a limited part, there is a doubt as to whether or not it is effective. In the majority of SMD type vibrators which are placed on the market, although thickness or cost of the piezoelectric vibrator increases, distortion is eliminated by gluing each short edge of a quartz vibrating reed onto a flat spring. Further, it is expected that a combination of both soft and hard adhesives disclosed in Japanese Utility Model Laid Open Publication No. Hei 5-18121 will be effective. However, since the '121 document does not enable a manufacturing method to be completed, there is a drawback to the realization. More specifically, a soft silicon adhesive is dissolved at approximately 350° C., but heretofore a sealing temperature of the glass having a low melting point to seal the lid and lower case of a box type container was 370° C. at the lowest. Thus, sealing work leads to dissolution of the silicon adhesive in the container, and ingredients generated splash and adhere to a surface of the quartz vibrating reed, thereby shifting a frequency. The attachment is not stable, so that there is a fear of omission. This causes variation of frequency with time. Further, gases generated may spoil an atmosphere or a degree of vacuum inside the container and may exert a harmful influence on the CI or the temperature characteristic. Moreover, there are no documents which have mentioned the difficulties described above. The art of providing the stoppers in the cantilever supporting method (2) which has been disclosed in Japanese Patent Laid-Open Publication No. Hei 8-330886 is also same as the above, as far as incompleteness of the manufacturing method is concerned. Also, the optimum material for the stoppers has not been mentioned.

SUMMARY OF THE INVENTION

An object of the present invention is to realize a piezoelectric vibrator housed in a box type container and having a center supporting or cantilever supporting piezoelectric vibrating reed which is capable of efficiently absorbing residual stress caused by adhesion and additive stress caused by temperature change and also having excellent quality and performance.

In the present invention, the center supporting constitution of the piezoelectric vibrating reed is such that one edge of the piezoelectric vibrating reed is fixed, supported, and connected by a conductive adhesive, and the other edge is glued to a lower case with a soft adhesive. Further, a lid and the lower case are sealed by sealing glass having a low melting point which is not dissolved by soft adhesive. Thus, shifting of frequency resulting from the sealing is slight and stress absorption characteristic of the soft adhesive is brought into full scope, whereby it is almost possible to completely alleviate the occurrence of residual stress which may be caused by mounting the piezoelectric vibrating reed.

Further, there is hardly any additive stress which may be caused by a variation in temperature or the like, which means there is hardly any variation of frequency in assembly and there is no abnormality in the temperature characteristic. Due to a buffer effect of the soft adhesive, the piezoelectric vibrator is excellent in impact resistance and the piezoelectric vibrating reed is stationary inside the container, whereby a surplus space is not required and a thin case can also be realized. Incidentally, it is preferable to have the Young's modulus ratio of over 500 of a hard conductive adhesive to a soft nonconductive adhesive.

Further, the cantilever supporting constitution of the piezoelectric vibrating reed is such that a stopper made of the soft adhesive is provided near the other edge of the piezoelectric vibrating reed and the case is sealed using the sealing glass having a low melting point which is not dissolved by the soft adhesive, as a result of which there is no shift of frequency which may be caused by the sealing and an excellent shock absorbing stopper in which the characteristic of the soft adhesive is brought into full scope is realized. Further, due to the cantilever supporting constitution, there is practically neither residual stress which may be caused by the support nor additive stress which may be caused by a variation of working temperature, and there is neither variation of frequency nor abnormality in temperature characteristic which may be caused by the assembly. Since a suitable clearance is provided between the piezoelectric vibrating reed and the stopper, the stopper is not responsive to normal acceleration which is encountered at the time of daily operation, and only when an impulse of over a specified strength which may cause damage of a supporting section is given due to the conductive adhesive, the piezoelectric vibrating reed and the stopper made of the soft adhesive colliding so as to prevent damage of the piezoelectric vibrating reed itself or the supporting section. Further, by controlling the quantity of the soft adhesive and the above-mentioned clearance, it is possible to control a total thickness of the piezoelectric vibrating reed so as not to be excessive and to be at an appropriate value.

Further, in both the center supporting and cantilever supporting constitution, it is possible to heighten the realization of the above by using a high molecular thermoviscous resin for the conductive adhesive.

BRIEF DESCRIPTION OF THE DRAWINGS

FIG. 1(*a*) is a plan view after removing a lid; FIG. 1(*b*) is a sectional view taken along line A—A.

FIG. 6(*a*) is a plan view after removing the lid; FIG. 6(*b*) is a sectional view taken along line B—B.

BEST MODE FOR CARRYING OUT THE INVENTION

[First embodiment]

Figure 1A:
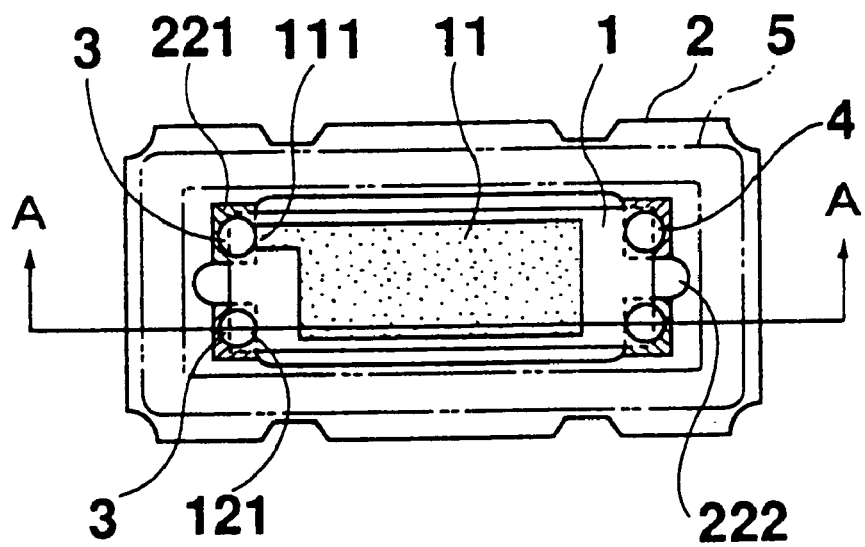
FIGS. 1(*a*) and 1(*b*) show an example of a first embodiment according to the present invention.
Figure 1B:
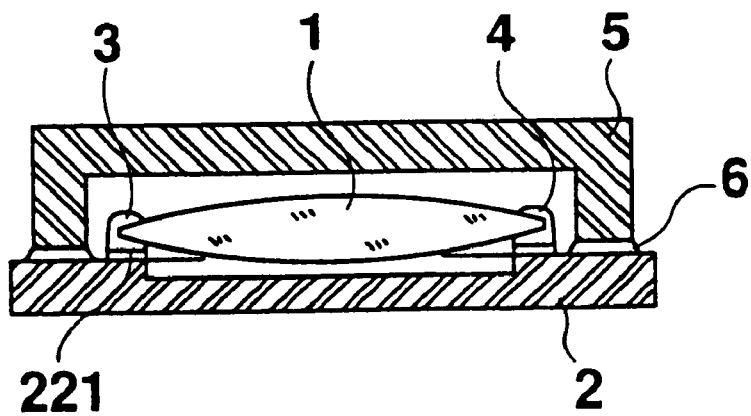
Figure 2:
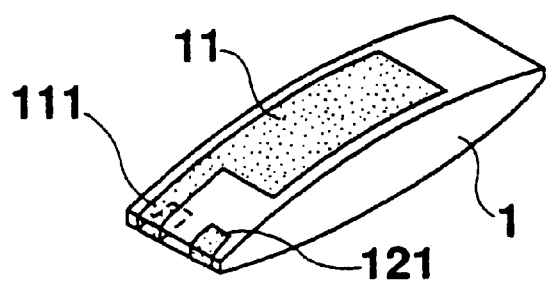
FIG. 2 is a perspective view showing an example of piezoelectric vibrating reeds.
Figure 3:
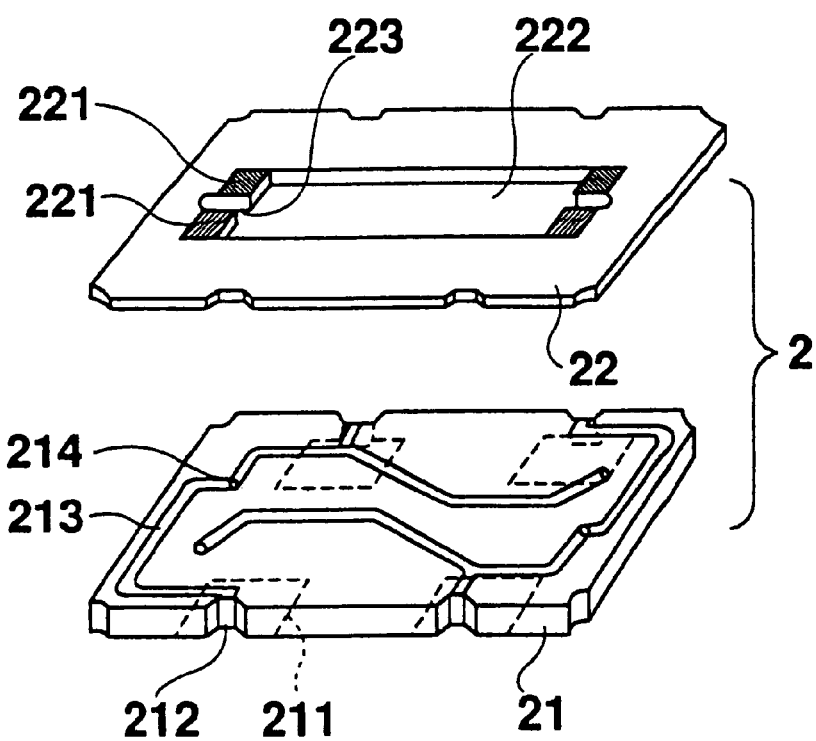
FIG. 3 is an exploded perspective view showing an example of lower cases.
Figure 4:
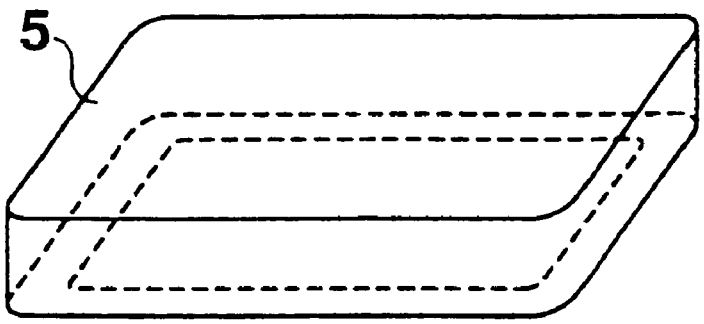
FIG. 4 is a perspective view showing an example of lids.

FIGS. 1(a) and 1(b) show a piezoelectric vibrator which is an example of a first embodiment according to the present invention. FIG. 1(a) is a plan view (a case in which the lid is removed); FIG. 1(b) is a sectional view taken along line A—A (a case in which the lid is put on). The same numerals are given to the parts already described in the conventional examples and the description of these parts is omitted. These parts are: each part of a quartz vibrating reed 1 (refer to FIG. 2); each part of a lower case 2 (an integral lamination of a first insulating substrate 21 and a second insulating substrate 22 both of which are shown in FIG. 3); and a lid 5 (refer to FIG. 4).

In FIGS. 1(a) and 1(b), conductive adhesives 3 provided at two places glue electrode leader lines 111 and 121 of the quartz vibrating reed 1 which serves as a piezoelectric vibrating reed to two terminals 221 for the vibrating reed of the lower case 2, respectively, and these are mechanically fixed simultaneously with electrical connection. The distance between two adhered places is short because only one short edge is employed. There is a case where a conductive adhesive whose base material is a thermosetting epoxy resin or the like becomes too hard after curing due to an influence of thermal stress. In order to fully relax the thermal stress, a conductive adhesive having slight flexibility is used. More specifically, it is suitable to use a conductive adhesive which is made by mixing a silver flake with a high molecular thermoviscous (thermoplastic) resin, for example a polysulfone resin, rather than a thermosetting resin. The other short edge of the quartz vibrating reed 1 is glued with a soft nonconductive (insulating) silicon adhesive 4 to the other two terminals 221 for vibrating reeds of the lower case. Due to its flexibility, the soft adhesive 4 not only relaxes all stress (distortion) which remains after assembly of the piezoelectric vibrator or arises during the operation, but also further improves impact resistance. As described above, the piezoelectric vibrating reed 1 can be securely supported on the lower case by gluing it to the lower case at two places with the soft adhesive 4.

Particularly, the conductive adhesive 3 is applied in such a manner that it covers both of the top and bottom surfaces of the piezoelectric vibrating reed 1. Thus, the piezoelectric vibrating 1 reed can be securely fixed in such a manner that one end of the piezoelectric vibrating reed 1 is held from the upper and lower sides. Further, the soft adhesive 4 is also applied in such a manner that it covers both of the top and bottom surfaces of the piezoelectric vibrating reed 1, and the piezoelectric vibrating reed 1 is held from the upper and lower sides.

Further, as shown in FIGS. 1(a) and 1(b), both the conductive adhesive 3 and the soft adhesive 4 for supporting short edges of the piezoelectric vibrating reed 1 at the points have a circular base and a semi-spherical head, respectively.

Figure 5:
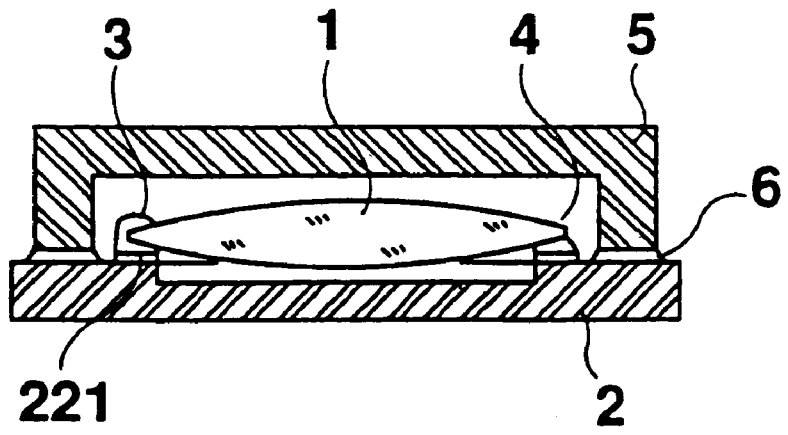
FIG. 5 is a sectional view showing an exemplified case in which a soft adhesive is applied only between a bottom surface of the piezoelectric vibrating reed and the lower case.

FIG. 5 is a sectional view showing an exemplified case in which the soft adhesive is applied only between the bottom surface of the piezoelectric vibrating reed 1 and the lower case. Compared with the constitution of FIG. 1 in which the soft adhesive 4 is applied to the upper and lower sides of the piezoelectric vibrating reed 1, the extent of frequency shift before and after the sealing can be reduced. For example, when compared to using a quartz vibrator having a frequency of 4.8 megahertz, the average extent of shift can be reduced from −23.2 ppm to −5.1 ppm and a standard deviation of dispersion can be reduced from 19.7 ppm to 4.3 ppm. Sealing glass 6 having a low melting point airtightly seals the lower case 2 and the lid 5. A sealing temperature of the sealing glass 6 is 340° C. or less, actually approximately 320° C., and the sealing work does not lead to dissolution and decomposition of the soft adhesive 4.

The soft adhesive employed in this embodiment is, for example, a single liquid nonconductive type and it was originally developed for die bonding to be carried out for stress relaxation of semiconductors. This adhesive becomes hard in the shape of elastomer and is adhered in a short period of time after application and heating. The main characteristics after hardening are: tensile strength of 22 kgf/cm$^2$ at 25° C.; ductility of 220%; Young's modulus of 11 kgf/cm$^2$; and adhesive strength of 6.5 kgf/cm$^2$. Incidentally, Young's modulus of a conductive adhesive for support and fixation is 42,000 kgf/cm$^2$, whereas Young's modulus of a soft adhesive is only one 3800th of that. This evidently shows how flexible the soft adhesive is. It is preferable that Young's moduli of the conductive adhesive and the soft adhesive to be used for the present invention are in the ratio of 500 or more to 1. If the ratio is 1000 or more to 1, it will be more preferable. Further, the sealing glass whose main component is a plumbic oxide is the one which has obtained characteristics (strength, moisture resistance, etc.) almost the same as those of conventional glass by adding an agent for adapting to the coefficient of thermal expansion of a ceramic material (A1203) of the case although the sealing glass has a low melting point of 320° C. which the conventional sealing glass does not have.

Another embodiment of the present invention will subsequently be described. The piezoelectric vibrating reed to be employed in this embodiment does not have to be restricted to the so-called biconvex type piezoelectric vibrating reed of FIG. 2 whose center is thick. It is preferable that the piezoelectric vibrating reed is plate type, for example. Further, it is also preferable that the piezoelectric vibrating reed is not a rectangular plate, but a circular plate, for example. If the piezoelectric vibrating reed is a circular plate, the edges facing each other will be partial circular arcs provided near both ends of a line which is the diameter of the circular plate. The material of the piezoelectric vibrating reed may be a piezoelectric material rather than quartz.

Further, constitution of the container does not have to be restricted to the one shown in FIG. 3. Specifically, it will be sufficient if the container which can be sealed by glass having a low melting point is employed. Further, it is sufficient if the conductive adhesive increases in number according to the number of electrodes. The materials of the soft adhesive and the sealing glass are also not restricted to those exemplified. Mounting of the piezoelectric vibrating reed and sequence and conditions of assembling process of the piezoelectric vibrator are not restricted to the above.

[Second embodiment]

Figure 6A:
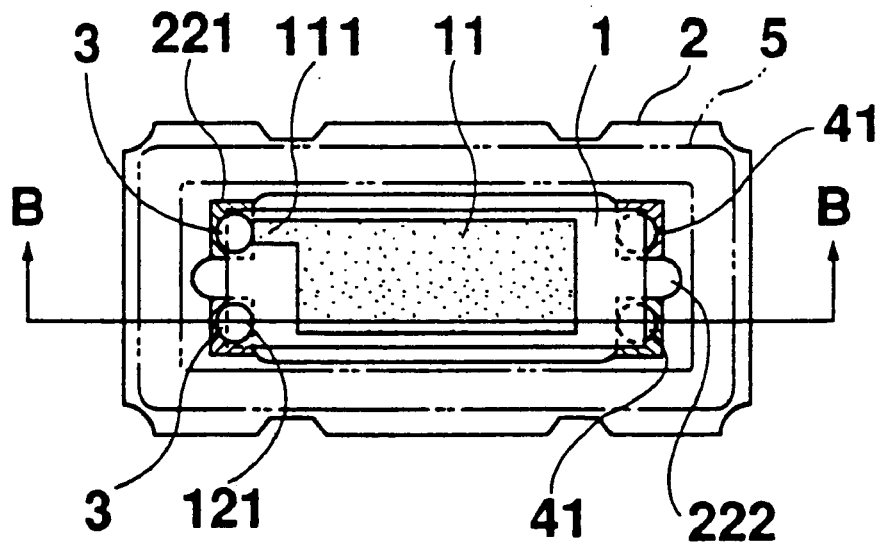
FIG. 6 shows an example of a second embodiment according to the present invention.
Figure 6B:
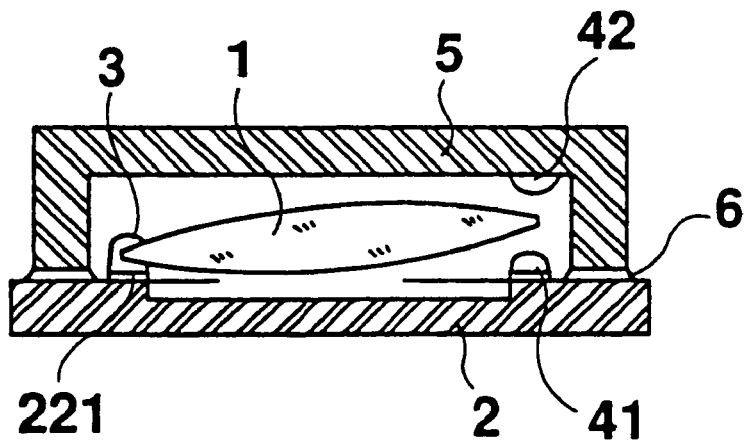

FIGS. 6(a) and 6(b) show an exemplified piezoelectric vibrator according to a second embodiment of the present invention. FIG. 6(a) is a plan view (a case in which the lid is removed); FIG. 6(b) is a sectional view taken along line B—B (a case in which the lid is put on). The same numerals are given to the parts already described and repetitive description of these parts is omitted.

In FIGS. 6(a) and 6(b), the conductive adhesives provided at two places have the same constitution as that of the first embodiment.

A stopper 41 is a lump of soft adhesive placed on the lower case 2 in close vicinity to one short edge of the quartz vibrating reed 1 which is not fixed. A stopper 42 is a lump of soft adhesive placed inside the lid 5 in close vicinity to one short edge of the quartz vibrating reed 1 which is not fixed. There is a slight clearance between the quartz vibrating reed 1 and each of the stoppers 41 and 42 as shown in the drawings. How to manage the clearance is, for example, as follows. First, a small amount of conductive adhesive 3 and a soft adhesive for the stopper 41 are placed. After temporarily curing a part of the conductive adhesive 3 using the art disclosed in Japanese Patent Laid-Open Publication No. Hei 8-186457 which is given in the description of the conventional example, the piezoelectric vibrating reed 1 is placed on these adhesives. When the conductive adhesive 3 is then further added and cured, the other end of the piezoelectric vibrating reed 1 is lifted from a top surface of the stopper 41 due to the shrinkage which occurs during a curing process of the conductive adhesive 3, whereby a proper clearance can be obtained. A clearance between the piezoelectric vibrating reed 1 and the other stopper 42 is determined by selecting the depth of the lid 5 in consideration of a thickness of the piezoelectric vibrating reed 1, the aforementioned clearance between the stopper 41 and the piezoelectric vibrating reed 1, thickness of each of the soft adhesives which are the stoppers 41 and 42, and a thickness of the sealing glass 6. The sealing glass 6 having a low melting point airtightly seals the lower case 2 and the lid 5.

The sealing temperature of the glass is 340° C. or less, actually approximately 320° C., and the sealing work does not lead to dissolution and decomposition the stoppers 41 and 42 which are made of soft adhesive.

What is claimed is:

1. A piezoelectric vibrator, wherein one edge of a plate-shaped piezoelectric vibrating reed is fixed at two places of a case by a comparatively hard conductive adhesive;

the other edge of said piezoelectric vibrating reed is fixed at two other places of said case by a comparatively soft adhesive;

said case and a lid which covers said piezoelectric vibrating reed are sealed using a glass agent containing plumbic oxide as a main component and having a low melting point of 340° C. or less; and Young's moduli of said comparatively hard conductive adhesive and said comparatively soft adhesive are in a ratio of 500 or more to 1.

2. The piezoelectric vibrator according to claim 1, wherein said comparatively hard conductive adhesive is applied in such a manner that both top and bottom surfaces of said piezoelectric vibrating reed are covered.

3. A piezoelectric vibrator, wherein one edge of a plate-shaped piezoelectric vibrating reed is fixed at two placed of a case by a comparatively conductive adhesive;

the other edge of said piezoelectric vibrating reed is fixed at two other places of said case by a comparatively soft adhesive;

said case and a lid which covers said piezoelectric vibrating reed are sealed using a glass agent containing plumbic oxide as a main component and having a low melting point of 340° C. or less; and wherein said comparatively hard adhesive is applied in such a manner that both top and bottom surfaces of said piezoelectric vibrating reed are covered; and wherein said comparatively soft adhesive is applied in such a manner that both top and bottom surfaces of said piezoelectric vibrating reed are covered.

4. The piezoelectric vibrator according to claim 2, wherein said comparatively soft adhesive is applied only to a case side of said piezoelectric vibrator.

5. A piezoelectric vibrator, wherein one edge of a plate-shaped piezoelectric vibrating reed is fixed at two places of a case by a comparatively hard conductive adhesive;

the other edge of said piezoelectric vibrating reed is fixed at two other places of said case by a comparatively soft adhesive;

said case and a lid which covers said piezoelectric vibrating reed are sealed using a glass agent containing plumbic oxide as a main component and having a low melting point of 340° C. or less; and wherein said case and lid are made of ceramic; said comparatively hard conductive adhesive is a high molecular thermoviscous adhesive; and said comparatively soft adhesive is a silicon nonconductive adhesive.

6. The piezoelectric vibrator according to claim 5, wherein said comparatively hard conductive adhesive is made by adding a silver flake to a polysulfone resin which is a base material of said adhesive.

7. A piezoelectric vibrator, wherein one edge of a plate-shaped piezoelectric vibrating reed is fixed at two places of a case by a comparatively hard conductive adhesive;

stoppers composed of soft adhesives are formed on a surface of a lid and a case, both of which approach from upper and lower sides, respectively, the other edge of said piezoelectric vibrating reed; and said case and a lid which covers said piezoelectric vibrating reed are sealed using a glass agent containing plumbic oxide as a main component and having a low melting point of 340° C. or less.

8. The piezoelectric vibrator according to claim 7, wherein said comparatively hard conductive adhesive is applied in such a manner that both top and bottom surfaces of said piezoelectric vibrating reed are covered.

9. A piezoelectric vibrator, wherein one edge of a plate-shaped piezoelectric vibrating reed is fixed at two places of a case by a comparatively hard conductive adhesive;

stoppers composed of soft adhesives are formed on a surface of a lid and a case, both of which approach from upper and lower sides, respectively, the other edge of said piezoelectric vibrating reed;

said case and a lid which covers said piezoelectric vibrating reed are sealed using a glass agent containing plumbic oxide as a main component and having a low melting point of 340° C. or less;

said case and lid are made of ceramic; said comparatively hard conductive adhesive is a high molecular thermoviscous adhesive; and said comparatively soft adhesive is a silicon nonconductive adhesive.

10. The piezoelectric vibrator according to claim 9, wherein said comparatively hard conductive adhesive is made by adding a silver flake to a polysulfone resin which is a base material of said adhesive.

* * * * *